United States Patent [19]

Watanabe

[11] Patent Number: 5,467,048
[45] Date of Patent: Nov. 14, 1995

[54] SEMICONDUCTOR DEVICE WITH TWO SERIES-CONNECTED COMPLEMENTARY MISFETS OF SAME CONDUCTION TYPE

[75] Inventor: Yoshiharu Watanabe, Kawasaki, Japan

[73] Assignee: Fujitsu Limited, Kawasaki, Japan

[21] Appl. No.: 282,548

[22] Filed: Jul. 29, 1994

[30] Foreign Application Priority Data

Nov. 15, 1993 [JP] Japan ................... 5-284638

[51] Int. Cl.⁶ .............................. H03K 17/687
[52] U.S. Cl. .................. 327/436; 327/534; 327/566; 326/69; 326/73
[58] Field of Search .................. 326/69, 73; 327/436, 327/534, 566

[56] References Cited

U.S. PATENT DOCUMENTS

| | | | |
|---|---|---|---|
| 3,702,943 | 11/1972 | Heuner et al. | 307/235 |
| 4,259,686 | 3/1981 | Suzuki et al. | 307/262 |
| 4,326,136 | 4/1982 | Le Can et al. | 307/451 |
| 4,647,798 | 3/1987 | Crafts et al. | 307/451 |
| 5,227,675 | 7/1993 | Taguchi | 327/534 |
| 5,243,228 | 9/1993 | Maruyama et al. | 327/534 |
| 5,381,056 | 1/1995 | Murphy | 327/534 |

*Primary Examiner*—Margaret Rose Wambach
*Attorney, Agent, or Firm*—Nikaido, Marmelstein, Murray & Oram

[57] ABSTRACT

A low-voltage driven semiconductor device is simple to fabricate, operates at high speed, and consumes low power. The semiconductor device is made of first and second MISFETs connected in series. The MISFETs have channels of the same conduction type. If the conduction type is n, the drain and gate of the first MISFET are connected to the high-potential side of a power source. The source and well of the second MISFET are connected to the low-potential side of the power source. The well of the first MISFET and the gate of the second MISFET are connected to a signal input terminal. A voltage applied to ends of the MISFETs and the potential fluctuation range of a signal supplied to the signal input terminal are each set to be lower than a voltage determined by a built-in potential (a forward withstand voltage) of a pn junction between a well of the first MISFET and a diffusion layer of the same. The diffusion layer is one that is adjacent to the second MISFET. No current will flow from the diffusion layer to the well because no forward voltage larger than the forward withstand voltage of the pn junction flows through the pn junction.

21 Claims, 4 Drawing Sheets

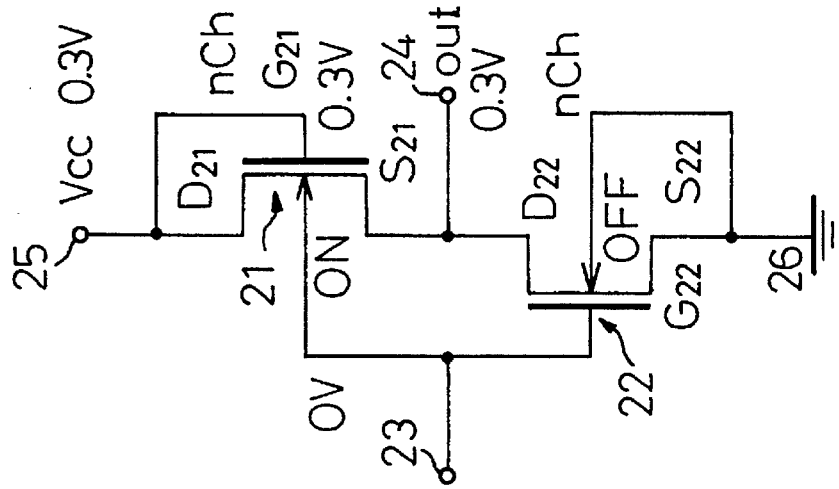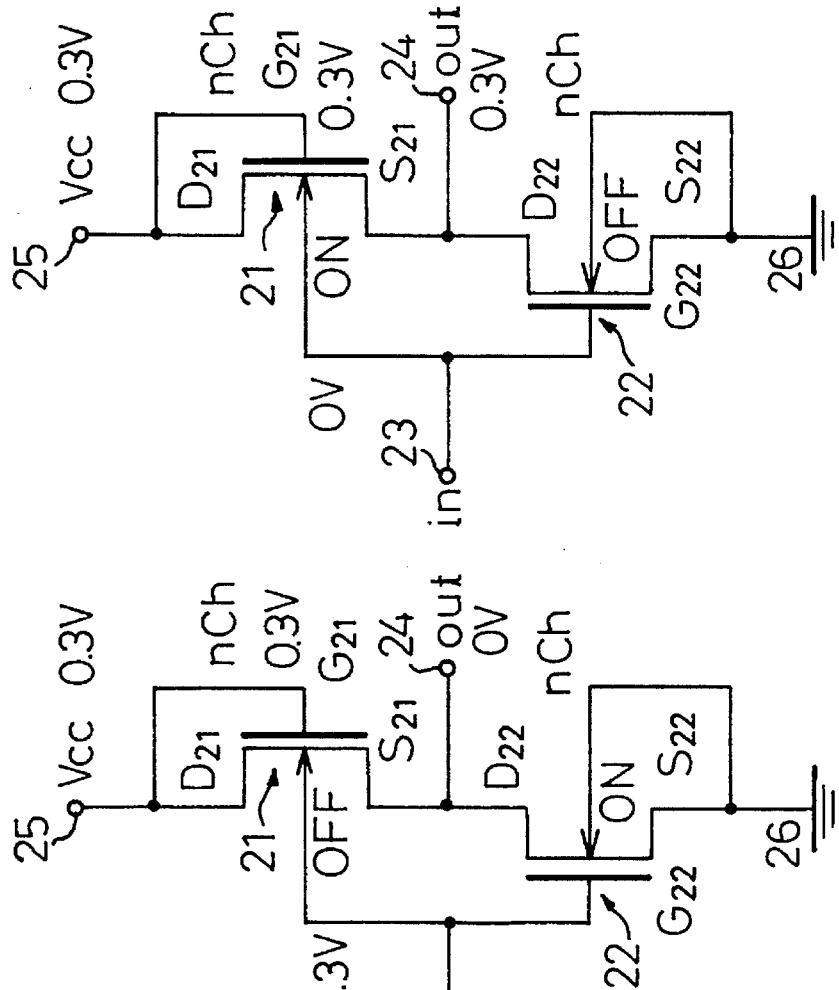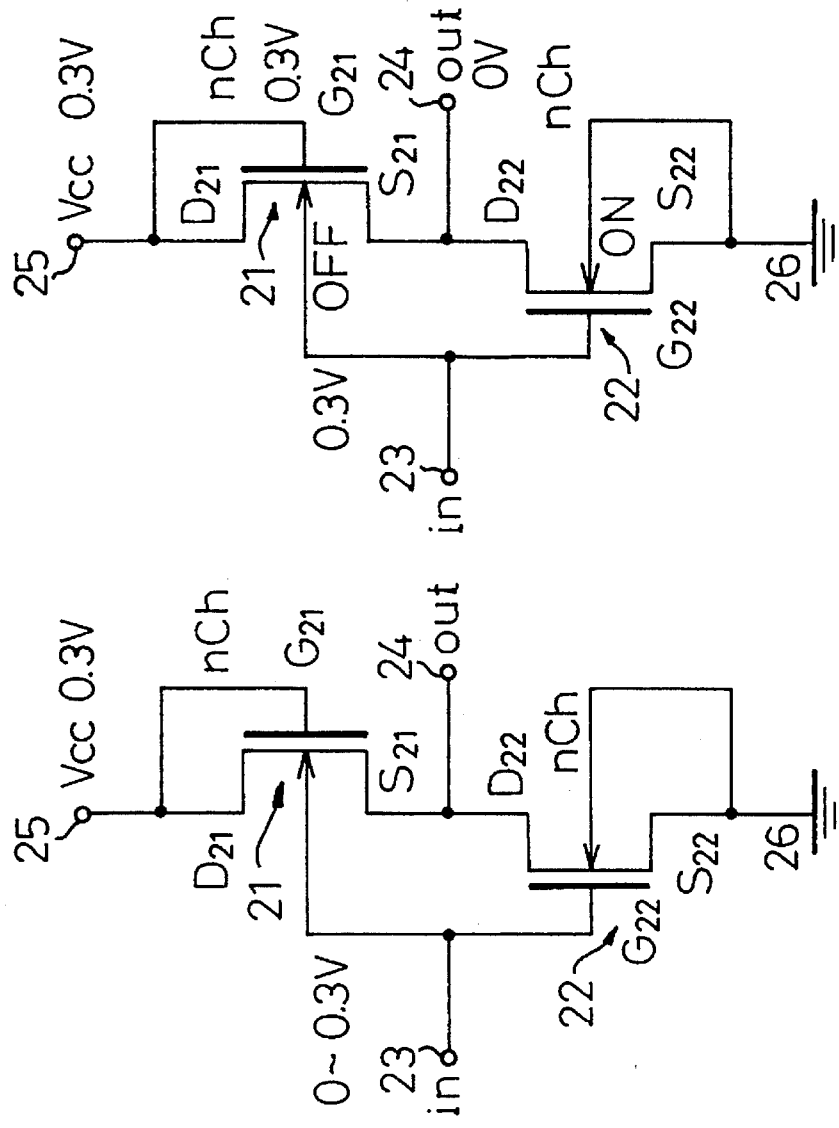

SEMICONDUCTOR DEVICE WITH TWO SERIES-CONNECTED COMPLEMENTARY MISFETS OF SAME CONDUCTION TYPE

BACKGROUND OF THE INVENTION

1. Field of the Invention

The present invention relates to a semiconductor device that is easy to fabricate and consumes low power.

2. Description of the Related Art

Semiconductor devices these days employ fine elements to realize high integration and operation speed. However, it is required to further scale down the elements of the semiconductor devices.

Scaling down the elements, however, has some limits due to the dielectric strength of each element and a terminal-to-terminal dielectric strength. In each element, the strength of an electric field applied to an insulation film must be below a predetermined value, and accordingly, a power source voltage for the element must be below a predetermined value. The limited power source voltage means a slow operation speed.

To realize a low-voltage high-speed operation, conventional semiconductor devices employ ED-(enhancement-depletion) MOS circuits, EE-MOS circuits, and CMOS circuits.

The EE-MOS circuit employs an enhancement FET as a load resistor. This FET is of the same kind as a FET serving as a switching element. The ED-MOS circuit employs a depletion FET as a load resistor. The EE- and ED-MOS circuits may each employ two MISFETs having channels of the same conduction type to simplify fabrication processes. The load FET is ON even during a non-operation period, to cause a problem of large power consumption. Portable word processors and notebook computers employ primary batteries or secondary batteries such as nickel-cadmium batteries. To extend the life of these batteries, semiconductor devices for these portable machines must be of low power consumption.

The CMOS circuit employs two FETs of different conduction types, i.e., an n-channel FET and a p-channel FET connected in series. The gates of the FETs are connected to a signal input terminal, and the two FETs operate complementarily. More precisely, only one of the FETs is ON to cause no through current and reduce power consumption. The CMOS circuit, however, involves complicated fabrication processes because it employs a mixture of n- and p-channel FETs. In addition, fine adjustment is needed to properly control the characteristics of the p- and n-channel FETs. The p-channel FET is poor in driving ability compared with the n-channel FET, so that the p-channel FET must have a wide element width to pass a large current. This results in increasing the area of the element.

In this way, there are no conventional semiconductor devices that meet the requirements of simplifying fabrication processes and reducing power consumption.

SUMMARY OF THE INVENTION

An object of the present invention is to provide a high-speed semiconductor device that is simple to fabricate and consumes low power.

In order to accomplish the object, the present invention provides a semiconductor device employing MISFETs of the same channel type.

When the channel type is n, the first and second MISFETs are connected in series. The drain and gate of the first MISFET are connected to the high-potential side of a power source. The source and well of the second MISFET are connected to the low-potential side of the power source. The well of the first MISFET and the gate of the second MISFET are connected to a signal input terminal. A voltage applied to ends of the MISFETs and the potential fluctuation range of a signal provided to the signal input terminal are each set to be lower than a voltage determined by a built-in potential of a pn junction between a well of the first MISFET and a diffusion layer of the first MISFET. This diffusion layer is one adjacent to the second MISFET.

When the channel type is p, the first and second MISFETs are connected in series. The drain and gate of the first MISFET are connected to the low-potential side of a power source. The source and well of the second MISFET are connected to the high-potential side of the power source. The well of the first MISFET and the gate of the second MISFET are connected to a signal input terminal. A voltage applied to ends of the MISFETs and the potential fluctuation range of a signal provided to the signal input terminal are each set to be lower than a voltage determined by a built-in potential of a pn junction between a well of the first MISFET and a diffusion layer of the first MISFET. This diffusion layer is one adjacent to the second MISFET.

It is preferable to fabricate the two MISFETs in separate wells. They may be fabricated on the same substrate if the resistance of the substrate is sufficiently high and if the position of the substrate connected to the signal input terminal and the position of the substrate connected to the high- or low-potential side of the power source are sufficiently spaced away from each other.

When the MISFETs are of n-channel type, the first MISFET is ON and the second MISFET is OFF with respect to an input signal whose level is equal to the low-potential side of the power source. In this case, a node between the MISFETs is at a level equal to the high-potential side of the power source.

When the input signal is at a level equal to the high-potential side of the power source, the first MISFET is OFF and the second MISFET is ON. In this case, the node between the MISFETs is at a level equal to the low-potential side of the power source, and the well of the first MISFET is at a level equal to the high-potential side of the power source. Accordingly, a voltage is applied to the pn junction between the well of the first MISFET and the diffusion layer of the first MISFET adjacent to the second MISFET. Since the voltage applied to the pn junction is lower than the voltage determined by the built-in potential of the pn junction, no current flows from the diffusion layer to the well through the pn junction.

In this way, the two MISFETs complementarily operate according to the level of the input signal, to achieve an inverter function. Namely, this circuit with two MISFETs of the same conduction type operates in the same manner as the CMOS circuit.

BRIEF DESCRIPTION OF THE DRAWINGS

The present invention will be more clearly understood from the description as set forth below with reference to the accompanying drawings, wherein:

FIGS. 1A to 1C are inverters according to prior arts each employing two MISFETs, in which FIG. 1A is a CMOS inverter, FIG. 1B is an ED inverter, and FIG. 1C is an EE inverter;

FIGS. 2A to 2C explain a principle of the present invention, in which FIG. 2A shows the voltage-current characteristics of a pn junction, FIG. 2B shows a model of the pn junction, and FIG. 2C is a circuit diagram;

FIGS. 3A to 3C are circuit diagrams showing an inverter according to first and second embodiments of the present invention, in which FIG. 3A shows voltage application conditions of the inverter, FIG. 3B shows a high-level input signal applied state, and FIG. 3C shows a low-level input signal applied state;

DESCRIPTION OF THE PREFERRED EMBODIMENTS

Before proceeding to a detailed description of the preferred embodiments of the present invention, prior art inverter circuits composed of two MISFETs will be described for a clearer understanding of the differences between the present invention and the prior art.

Figure 1A:
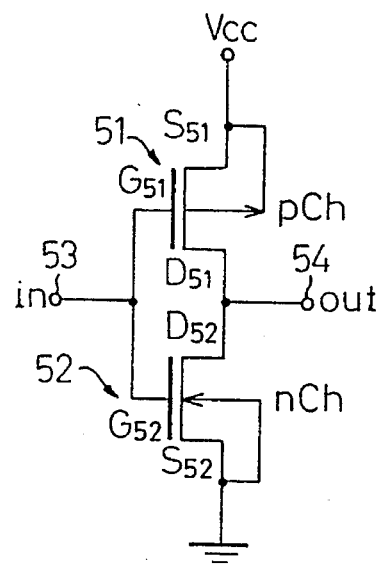
Figure 1B:
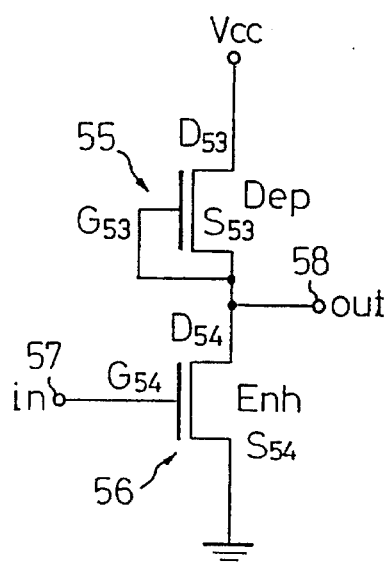
Figure 1C:
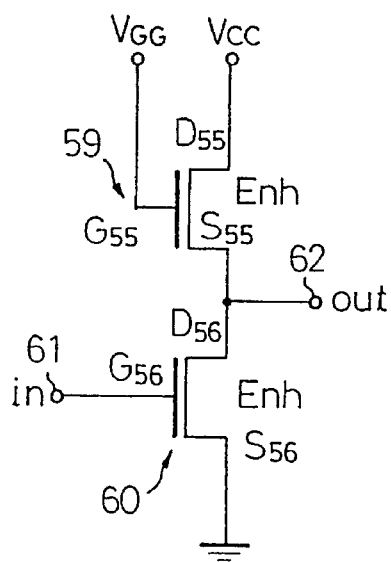

FIGS. 1A to 1C are circuit diagrams showing inverters employing each two MISFETs according to prior arts, in which FIG. 1A shows a CMOS inverter, FIG. 1B shows an ED inverter, and FIG. 1C shows an EE inverter.

In the figures, numeral 51 is a p-channel MISFET, 52 is an n-channel MISFET, 53, 57, and 61 are signal input terminals, 52, 58, and 62 are signal output terminals, 55 is a depletion MISFET, 56, 59, and 60 are enhancement MISFETs, $D_{51}$, $D_{52}$, $D_{53}$, $D_{54}$, $D_{55}$, and $D_{56}$ are drains, $S_{51}$, $S_{52}$, $S_{53}$, $S_{54}$, $S_{55}$, and $S_{56}$ are sources, and $G_{51}$, $G_{52}$, $G_{53}$, $G_{54}$, $G_{55}$, and $G_{56}$ are gates.

In the CMOS inverter of FIG. 1A, the drain $D_{51}$ of the p-channel MISFET 51 is connected to the drain $D_{52}$ of the n-channel MISFET 52, to form the signal output terminal 54. The gate $G_{51}$ of the MISFET 51 is connected to the gate $G_{52}$ of the MISFET 52, to form the signal input terminal 53. The source $S_{51}$ of the MISFET 51 is connected to a power source Vcc, and the source $S_{52}$ of the MISFET 52 is grounded.

A gate voltage and a drain current in the CMOS inverter have opposite polarities, so that one of the MISFETs is conductive when the other is nonconductive. The conductive MISFET operates in an unsaturated state. Since one of the MISFETs is always nonconductive, a current passing through the inverter is only one that charges a load capacitor through the p-channel element. In a steady state, only a leakage current flows, and therefore, the circuit's power consumption is very small. If a signal of positive polarity is applied to the signal input terminal, the n-channel MISFET 52 becomes conductive, and the output voltage becomes substantially zero. If the thresholds of the n- and p-channel MISFETs are adjusted to make the p-channel MISFET 51 conductive in response to a zero voltage applied to the signal input terminal, the output voltage becomes substantially equal to the power source voltage Vcc. Accordingly, the output voltage changes from zero to the power source voltage Vcc. The CMOS inverter has a high switching speed.

The CMOS inverters are advantageous as mentioned above, and therefore, they are widely used in circuits that must operate at low power consumption. To fabricate the CMOS inverters, elements of opposite conduction types must be formed on a single substrate, and a well whose conduction type is opposite to that of the substrate must be formed in the substrate. This increases the number of fabrication processes. In addition, a complicated process is required to adjust the characteristics of n- and p-channel MISFETs. The p-channel MISFET is poorer in driving ability than the n-channel MISFET, so that the p-channel MISFET must have a wider element width to pass a large current. This increases an element area.

In the ED inverter of FIG. 1B, the depletion MISFET 55 serves as a normally-ON load. When there is no input, the depletion MISFET 55 causes no voltage drop in an output and provides an output voltage equal to the power source voltage Vcc. The ED inverter, therefore, is operative with a single low-voltage power source. This ED inverter, however, consumes large power because the depletion MISFET 55 is ON even in an inoperative state.

In the EE inverter of FIG. 1C, the enhancement MISFET 59 serves as an unsaturated load, to provide an output voltage equal to the power source voltage Vcc. Similar to the ED inverter, the EE inverter consumes a large amount of power.

Figure 2A:
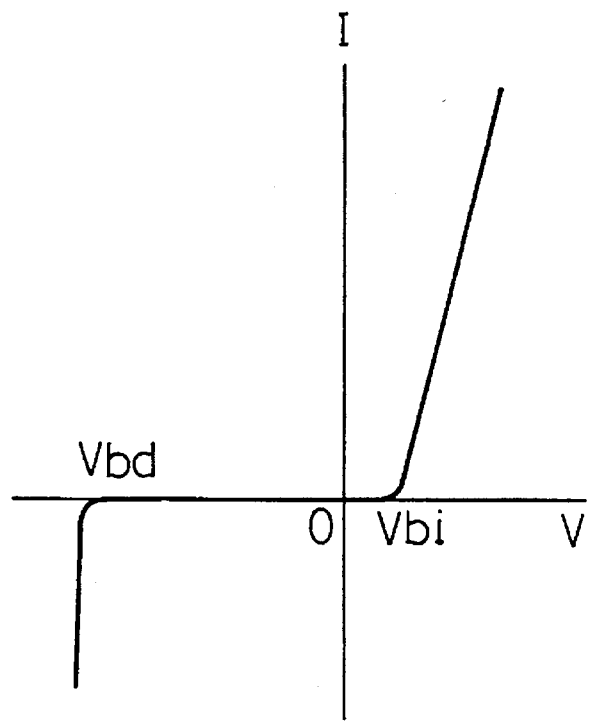
Figure 2B:
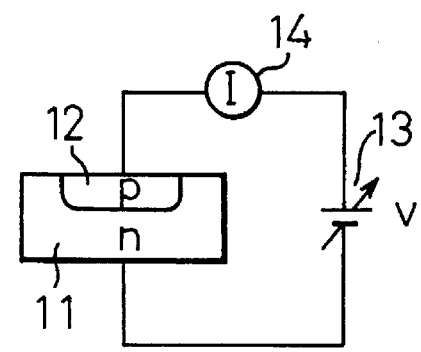
Figure 2C:
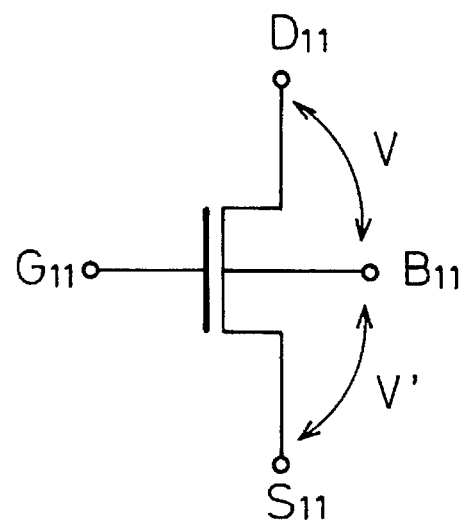

FIGS. 2A to 2C explain a principle of the present invention, in which FIG. 2A shows the voltage-current characteristics of a pn junction, FIG. 2B shows a model of the pn junction, and FIG. 2C is a circuit diagram.

In the figures, numeral 11 is an n-type substrate, 12 is a p-type region, 13 is a variable voltage power source, 12 is an ammeter, $D_{11}$ is a drain, $S_{11}$ is a source, and $G_{11}$ is a gate.

The p-type region 12 is formed on the n-type substrate 11 as shown in FIG. 2B. The variable voltage power source 13 applies a voltage to a pn junction between the substrate 11 and the region 12, and the ammeter 12 measures a current flowing through the pn junction. A result of the measurement is shown in FIG. 2A. When a forward voltage is applied to the pn junction, no current flows up to a built-in potential Vbi.

This built-in potential Vbi is about 0.5 V for silicon with a standard impurity concentration.

The built-in potential Vbi is generally expressed as follows:

$$Vbi = kT/q \cdot \ln(ND \cdot NA/ni^2)$$

where k is a Boltzmann's constant, T is an absolute temperature, q is the electric charge, ND is a donor concentration, NA is an acceptor concentration, and ni is the carrier concentration of intrinsic semiconductor that is $1.5 \times 10^{10}$ cm-3 (at room temperature).

According to this expression, the built-in potential Vbi will increase to about 1 V when the impurity concentration of silicon is $10^{16}$ cm$^{-3}$ in the well NA and $10^{21}$ cm$^{-3}$ in the junction diffusion layer ND.

If a backward voltage is applied to the pn junction, no current flows up to the breakdown voltage Vbd.

The breakdown voltage Vbd is dependent on the impurity concentration of silicon and is about 10 V at a usual impurity concentration.

In the semiconductor device according to the present invention, as shown in FIG. 2C, a bias voltage V at a pn junction between the substrate $B_{11}$ and the drain $D_{11}$, or a bias voltage V' at a pn junction between the substrate $B_{11}$ and the source $S_{11}$ is set to be below a voltage corresponding to the built-in potential Vbi. Then, the pn junction electrically separates circuit elements such as transistors from one another, to thereby provide the circuit elements with freedom in their polarities and positions. This means that the voltage determined by the built-in potential Vbi corresponds to a forward withstand voltage.

In this way, the present invention realizes the function of a CMOS inverter, which is conventionally formed of n- and p-channel MISFETs, with two n-channel MISFETs or two p-channel MISFETs.

Now, embodiments of the present invention will be explained.

FIGS. 3A to 3C show an inverter according to any one of the first and second embodiments of the present invention with various input voltages.

The inverter has a first n-channel MISFET 21, a second n-channel MISFET 22, an input terminal 23, an output terminal 22, a power source terminal 25, a grounding wire 26, drains $D_{21}$ and $D_{22}$, sources $S_{21}$ and $S_{22}$, and gates $G_{21}$ and $G_{22}$.

The source $S_{21}$ of the MISFET 21 is connected to the drain $D_{22}$ of the MISFET 22, to form the output terminal 22. The substrate of the MISFET 21 is connected to the gate $G_{22}$ of the MISFET 22, to form the input terminal 23. The drain $D_{21}$ of the MISFET 21 is connected to the power source Vcc 25, and the source $S_{22}$ of the MISFET 22 is connected to the grounding wire 26.

This inverter employs the first and second MISFETs 21 and 22 that are each of n-channel type, so that they are simple to fabricate.

In FIG. 3A, the power source voltage Vcc is, for example, 0.3 V that is lower than a built-in potential Vbi, and a voltage in the range of 0 to 0.3 V is applied to the input terminal 23.

In FIG. 3B, the power source voltage Vcc is maintained at 0.3 V, and a high-level voltage of 0.3 V is applied to the input terminal 23. Then, the substrate and gate $G_{21}$ of the MISFET 21 receive 0.3 V, and therefore, a voltage of 0 is applied to a gate insulation film to turn OFF the MISFET 21. The substrate of the MISFET 22 receives 0 V, and the gate $G_{22}$ thereof receives 0.3 V. If the threshold voltage of the MISFET 22 is lower than 0.3 V, the MISFET 22 is turned ON, and the output terminal 24 provides a low-level signal of about 0 V.

In FIG. 3C, the power source voltage Vcc is maintained at 0.3 V, and a low-level voltage of 0 V is applied to the input terminal 23. Then, the substrate of the MISFET 21 receives 0 V, and the gate $G_{21}$ thereof receives 0.3 V. If the threshold voltage of the MISFET 21 is lower than 0.3 V, the MISFET 21 is turned ON. Accordingly, the substrate and gate $G_{22}$ of the MISFET 22 receives 0 V, to apply a voltage of 0 to a gate insulation film. As a result, the MISFET 22 is turned OFF, and the output terminal 24 provides a high-level signal of about 0.3 V.

In this way, this circuit changes a high- or low-level input signal applied to the input terminal into a low- or high-level output signal, to thereby serve as an inverter.

Figure 4:
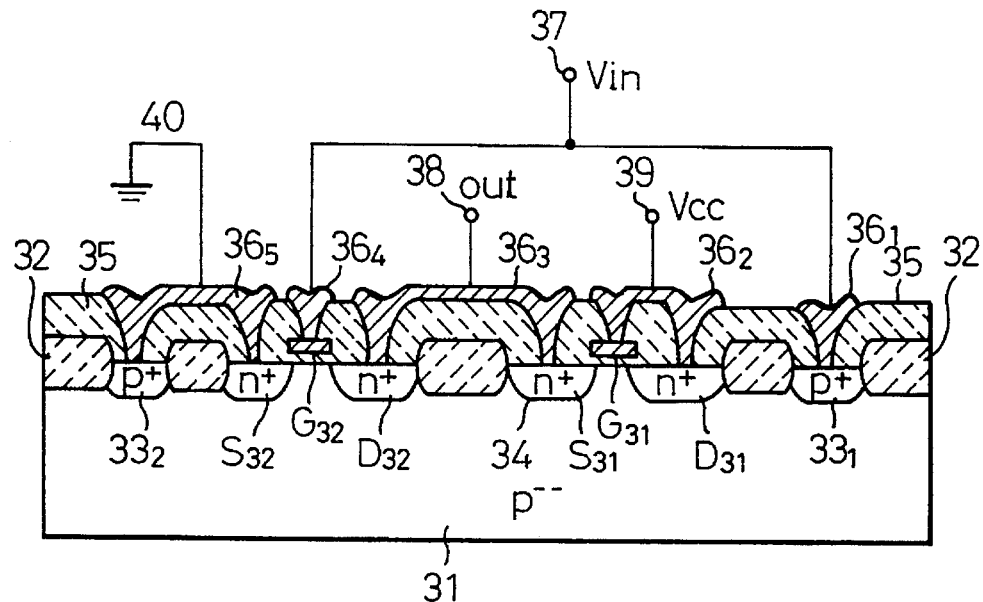
FIG. 4 is a sectional view showing an inverter according to the first embodiment.

FIG. 4 is a sectional view showing an inverter according to the first embodiment of the present invention.

The inverter has a p⁻ silicon substrate 31, a LOCOS film 32, p⁺ substrate contact regions $33_1$ and $33_2$, an element separating pn junction 34, an interlayer insulation film 35, wiring layers $36_1$, $36_2$, $36_3$, $36_4$, and $36_5$, an input terminal 37, an output terminal 38, a power source terminal 39, a grounding wire 40, drains $D_{31}$ and $D_{32}$, sources $S_{31}$ and $S_{32}$, and gates $G_{31}$ and $G_{32}$.

The LOCOS film 32 for defining element forming regions is formed on the p⁻ silicon substrate 31. In the element forming regions, there are formed the p⁺ substrate contact regions $33_1$ and $33_2$, drains $D_{31}$ and $D_{32}$, and sources $S_{31}$ and $S_{32}$. Between the drain $D_{31}$ and the source $S_{31}$, the gate $G_{31}$ is formed with a gate insulation film, and between the drain $D_{32}$ and the source $S_{32}$, the gate $G_{32}$ is formed with the gate insulation film. On the gates $G_{31}$ and $G_{32}$, the interlayer insulation film 35 is formed. On the film 35, the wiring layers $36_1$ to $36_5$ are formed, and the input terminal 37, output terminal 38, power source terminal 39, and grounding wire 40 are arranged.

The element separating pn junction 34 between the p⁻ silicon substrate 31 and the source $S_{31}$ is characteristic to the present invention.

When predetermined voltages, which are below the voltage determined by the built-in potential Vbi of the pn junction 34, are applied to the input terminal 37, output terminal 38, power source terminal 39, and grounding wire 40, the pn junction 34 electrically separates in forward and backward directions the first MISFET having the drain $D_{31}$, source $S_{31}$, and gate $G_{31}$ from the second MISFET having the drain $D_{32}$, source and gate $G_{32}$.

According to the first embodiment, voltages of Vin and0 are applied to the substrate 31 through the p⁺ substrate contact regions $3_1$ and $33_2$. If the resistance of the substrate is sufficiently high and if the regions $33_1$ and $33_2$ are sufficiently spaced apart from each other, a current flowing between the regions $33_1$ and $33_2$ is small and causes no problem. If this current is high enough to cause trouble, the second embodiment can resolve it.

Figure 5:
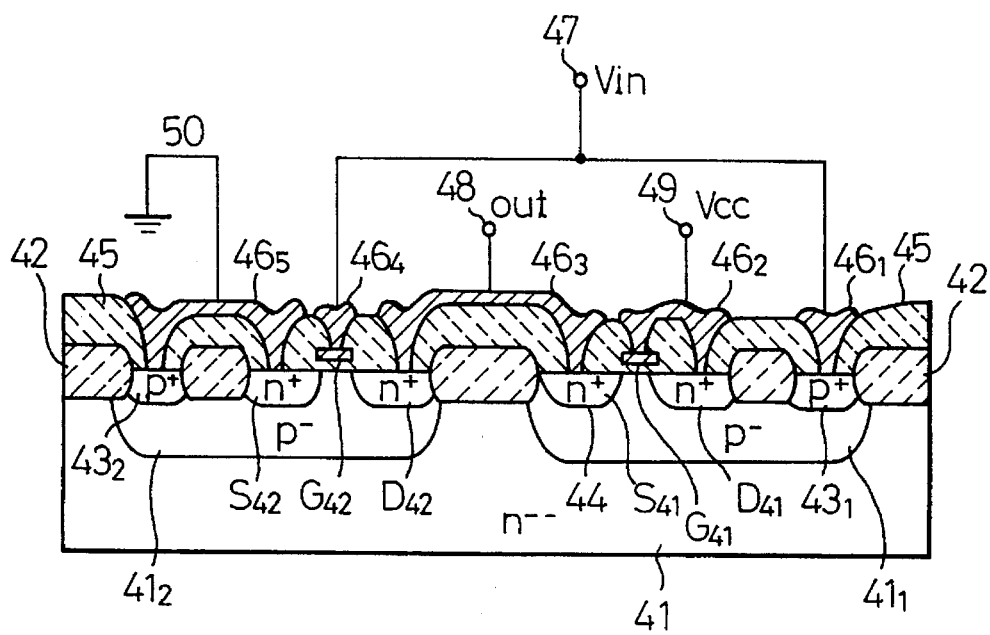
FIG. 5 is a sectional view showing an inverter according to the second embodiment.

FIG. 5 is a sectional view showing an inverter according to the second embodiment.

The inverter includes an n⁻ silicon substrate 41, a first p⁻ well $41_1$, a second p⁻ well $41_2$, a LOCOS film 42, p⁺ substrate contact regions $43_1$ and $43_2$, an element separating pn junction 44, an interlayer insulation film 45, wiring layers $46_1$, $46_2$, $46_3$, $46_4$, and $46_5$, an input terminal 47, an output terminal 48, a power source terminal 49, a grounding wire 50, drains $D_{41}$ and $D_{42}$, sources $S_{41}$ and $S_{42}$, and gates $G_{41}$ and $G_{42}$.

The first and second p⁻ wells $41_1$ and $41_2$ are formed on the n⁻ silicon substrate 41, and the LOCOS film 42 for defining element forming regions is formed on the wells $41_1$ and $41_2$. In the element forming regions, there are formed the p⁺ substrate contact regions and $43_2$, drains $D_{41}$ and $D_{42}$, and sources $S_{41}$ and $S_{42}$. Between the drain $D_{41}$ and the source $S_{41}$, the gate $G_{41}$ is formed with a gate insulation film, and between the drain $D_{42}$ and the source $S_{42}$, the gate $G_{42}$ is formed with the gate insulation film. On the gates $G_{41}$ and $G_{42}$, the interlayer insulation film 45 is formed. On the film 45, the wiring layers $46_1$ to $46_5$ are formed, and the input terminal 47, output terminal 48, power source terminal 49, and grounding wire 50 are arranged.

The element separating pn junction 44 between the p⁻ well $41_1$ and the source $S_{41}$ is characteristic to the present invention.

When predetermined voltages, which are below the voltage determined by the built-in potential Vbi of the pn junction 34, are applied to the input terminal output terminal 48, power source terminal 49, and grounding wire 50, the pn junction 44 electrically separates in forward and backward directions the first MISFET having the drain $D_{41}$, source $S_{41}$, and gate $G_{41}$ from the second MISFET having the drain $D_{42}$, source $S_{42}$, and gate $G_{42}$.

According to this embodiment, the LOCOS film 42 is present between the first p⁻ well $41_1$ in which the first MISFET is formed and the second p⁻ well $41_2$ in which the second MISFET is formed, to block a current flowing between the wells $41_1$ and $41_2$. This arrangement reduces power consumption and extends battery life when many inverters are integrated.

As explained above, the present invention uses the voltage determined by the built-in potential Vbi of an element separating pn junction to separate elements from each other. A semiconductor device according to the present invention employs only MISFETs of n- or p-channel type to provide the function of a CMOS inverter. The semiconductor device of the present invention has a simple structure, is easy to fabricate, needs only a low-voltage power source, operates at high speed, consumes low power, and achieves high performance.

I claim:

1. A semiconductor device comprising:

a first MISFET; and a second MISFET having a channel of the same conduction type as that of the first MISFET and connected in series with the first MISFET, the first and second MISFETs operating complementarily.

2. The semiconductor device according to claim 1, wherein the channels of the first and second MISFETs are formed in separate wells.

3. The semiconductor device according to claim 1, wherein the channels of the first and second MISFETs are formed in the same substrate.

4. The semiconductor device according to claim 2, wherein a voltage applied to ends of the first and second MISFETs is lower than the voltage determined by a built-in potential of a pn junction between the well and a diffusion layer of the first MISFET, the diffusion layer being one adjacent to the second MISFET.

5. The semiconductor device according to claim 3, wherein a voltage applied to ends of the first and second MISFETs is lower than the voltage determined by a built-in potential of a pn junction between the substrate and a diffusion layer of the first MISFET, the diffusion layer being one adjacent to the second MISFET.

6. The semiconductor device according to claim 2, wherein the first and second MISFETs are of n-channel type, the drain and gate of the first MISFET are connected to the high-potential side of a power source, the source and well of the second MISFET are connected to the low-potential side of the power source, the well of the first MISFET and the gate of the second MISFET are connected to a signal input terminal, and the potential fluctuation range of a signal supplied to the signal input terminal is within the voltage applied to the ends of the first and second MISFETs.

7. The semiconductor device according to claim 4, wherein the first and second MISFETs are of p-channel type, the drain and gate of the first MISFET are connected to the low-potential side of a power source, the source and well of the second MISFET are connected to the high-potential side of the power source, the well of the first MISFET and the gate of the second MISFET are connected to a signal input terminal, and the potential fluctuation range of a signal supplied to the signal input terminal is within the voltage applied to the ends of the first and second MISFETs.

8. The semiconductor device according to claim 5, wherein the first and second MISFETs are of n-channel type, the drain and gate of the first MISFET are connected to the high-potential side of a power source, the substrate and the source of the second MISFET are connected to the low-potential side of the power source, the substrate and the gate of the second MISFET are connected to a signal input terminal, and the potential fluctuation range of a signal supplied to the signal input terminal is within the voltage applied to the ends of the first and second MISFETs.

9. The semiconductor device according to claim 5, wherein the first and second MISFETs are of p-channel type, the drain and gate of the first MISFET are connected to the low-potential side of a power source, the substrate and the source of the second MISFET are connected to the high-potential side of the power source, the substrate and the gate of the second MISFET are connected to a signal input terminal, and the potential fluctuation range of a signal supplied to the signal input terminal is within the voltage applied to the ends of the first and second MISFETs.

10. The semiconductor device according to claim 6, wherein the absolute value of a channel threshold voltage in the first and second MISFETs is lower than the voltage determined by the built-in potential of the pn junction.

11. The semiconductor device according to claim 7, wherein the absolute value of a channel threshold voltage in the first and second MISFETs is lower than the voltage determined by the built-in potential of the pn junction.

12. The semiconductor device according to claim 8, wherein the absolute value of a channel threshold voltage in the first and second MISFETs is lower than the voltage determined by the built-in potential of the pn junction.

13. The semiconductor device according to claim 9, wherein the absolute value of a channel threshold voltage in the first and second MISFETs is lower than the voltage determined by the built-in potential of the pn junction.

14. The semiconductor device according to claim 10, wherein the first and second MISFETs serve as an inverter for inverting the signal supplied to the signal input terminal.

15. The semiconductor device according to claim 11, wherein the first and second MISFETs serve as an inverter for inverting the signal supplied to the signal input terminal.

16. The semiconductor device according to claim 12, wherein the first and second MISFETs serve as an inverter for inverting the signal supplied to the signal input terminal.

17. The semiconductor device according to claim 13, wherein the first and second MISFETs serve as an inverter for inverting the signal supplied to the signal input terminal.

18. The semiconductor device according to claim 14, wherein the semiconductor device is formed on a silicon substrate, and the absolute value of a voltage applied to the pn junction is equal to or below 1.0 V.

19. The semiconductor device according to claim 15, wherein the semiconductor device is formed on a silicon substrate, and the absolute value of a voltage applied to the pn junction is equal to or below 1.0 V.

20. The semiconductor device according to claim 16, wherein the semiconductor device is formed on a silicon substrate, and the absolute value of a voltage applied to the pn junction is equal to or below 1.0 V.

21. The semiconductor device according to claim 17, wherein the semiconductor device is formed on a silicon substrate, and the absolute value of a voltage applied to the pn junction is equal to or below 1.0 V.

* * * * *